United States Patent [19]
Kimura et al.

[11] Patent Number: 6,161,969
[45] Date of Patent: Dec. 19, 2000

[54] APPARATUS FOR PROCESSING A SUBSTRATE

[75] Inventors: Yoshio Kimura, Kikuchi-gun; Issei Ueda, Kumamoto, both of Japan

[73] Assignee: Tokyo Electron Limited, Tokyo, Japan

[21] Appl. No.: 09/412,977

[22] Filed: Oct. 6, 1999

[30] Foreign Application Priority Data

Oct. 20, 1998 [JP] Japan .................................. 10-316858

[51] Int. Cl.$^7$ ...................................................... G03D 5/00
[52] U.S. Cl. ........................ 396/611; 396/612; 414/937; 414/939; 414/225; 414/416
[58] Field of Search .................... 396/611, 636, 396/612; 414/225, 416, 937, 939, 940, 901–908; 118/52, 319

[56] References Cited

U.S. PATENT DOCUMENTS

| | | | |
|---|---|---|---|
| 5,664,254 | 9/1997 | Ohkura et al. | 396/612 |
| 5,826,129 | 10/1998 | Hasebe et al. | 396/611 |
| 6,024,502 | 2/2000 | Akimoto et al. | 396/611 |

FOREIGN PATENT DOCUMENTS 10-135307  5/1998  Japan .

Primary Examiner—D. Rutledge
Attorney, Agent, or Firm—Oblon, Spivak, McClelland, Maier & Neustadt, P.C.

[57] ABSTRACT

An apparatus for processing a substrate, comprises a cassette station for loading and unloading a cassette storing a plurality of substrates, a sub-transfer arm mechanism arranged in the cassette station, for loading/unloading a substrate into/from the cassette, and a process station for processing a plurality of substrates unloaded from the cassette station, simultaneously in parallel, in which the process station comprises a front-stage station block adjoined to the cassette station and having a plurality of first process units for processing a substrate, a first main transfer arm mechanism arranged in the front-stage station block, for transferring a substrate to/from the sub-transfer arm mechanism and loading/unloading the substrate into/from the first process unit, a rear-stage station block adjoined to the front-stage station block and having a plurality of second process units for processing a substrate, and a second main transfer arm mechanism arranged in the rear-stage station block for transferring a substrate to/from the first main transfer arm mechanism and loading/unloading the substrate into/from the second process unit, a relative positional relationship between the first process units and the first main transfer arm mechanism is substantially the same as that of the second process units and the second main transfer arm mechanism, and the first main transfer arm mechanism also loads/unloads the substrate directly to at least one of second process units belonging to the rear-stage station block.

20 Claims, 10 Drawing Sheets

APPARATUS FOR PROCESSING A SUBSTRATE

BACKGROUND OF THE INVENTION

The present invention relates to an apparatus for processing a substrate for applying a photolithographic process to a substrate such as a semiconductor wafer or a glass substrate for a liquid crystal display (LCD) device.

In a manufacturing process of the semiconductor device, photolithography is used. For example, the photolithographic process for manufacturing an LSI includes the steps of coating a resist on a semiconductor wafer, exposing the coated wafer to light, and developing it. Of the steps, the resist coating step and the developing step are performed by using a substrate processing apparatus disclosed in U.S. Pat. Nos. 5,664,254 or 5,826,129.

The conventional apparatuses described in these publications in the prior art have a process station for processing a plurality of wafers simultaneously in parallel. The process station has a plurality of multi-layered process unit groups and a main transfer arm mechanism. The main transfer arm mechanism has a holder capable of holding at least two wafers at the same time and a back-and-forth moving mechanism for moving the holder, an up-and-down moving mechanism for moving the holder in a Z-axis direction, and a θ-rotation driving mechanism for rotating the holder around the Z-axis. The multi-layered process unit groups are arranged so as to surround the main transfer arm mechanism. The main transfer arm mechanism transfers a wafer W to a coating unit, a developing unit, and a thermal process unit, sequentially. The wafer W is coated, baked, cooled and developed in the individual units.

In recent years, with a high integration and enlargement in wafer size, it has taken a longer time for manufacturing and inspecting the device than before. It has therefore been strongly desired to further increase a throughput of the photolithographic process. However, since a chemically amplified resist is usually exposed to a KrF excimer laser, which is weak in light intensity, time required for a developing process for the resist is longer than other treatment processes. Furthermore, time required for the resist coating is increased as the wafer increases in diameter.

To satisfy the desire to increase the throughput, if the number of the development units and coating units is increased by connecting a plurality of process stations to each other via a transfer unit, it is possible to improve the throughput in the time-consuming developing process and coating process and simultaneously to reduce stand-by time for the wafer in the developing and resist-coating processes.

However, if the number of the process stations is increased, time required for transferring the wafer between the process stations increases. More specifically, the wafer is transferred by a main transfer arm mechanism of a process station from the process station to a transfer unit, and further transferred to another process station from the transfer unit by another main transfer arm mechanism. As described, since the wafer is transferred between two main transfer arm mechanisms via the transfer unit, it takes too much time to transfer the wafer W, with the result that a throughput decreases.

Furthermore, if the wafer is transferred to the vertically-stacked four coating units or developing units by a single main transfer arm mechanism, an excessive load is applied to the single main transfer arm mechanism. As a result, the wafer cannot be smoothly transferred. To reduce the up-and-down moving amount of the main transfer arm mechanism (to reduce the load), it may be possible that two coating unit groups or two developing unit groups, each group being stacked in two stages, are arranged side by side and the wafer is transferred to four coating units or four developing units by a single main transfer arm mechanism. However, such an arrangement of the coating units or the developing units increases the footprint.

BRIEF SUMMARY OF THE INVENTION

An object of the present invention is to provide an apparatus for processing a substrate providing a high throughput with a small foot print.

According to the present invention, there is provided an apparatus for processing a substrate, comprising a cassette station for loading and unloading a cassette storing a plurality of substrates;

a sub-transfer arm mechanism arranged in the cassette station, for loading/unloading a substrate into/from the cassette; and a process station for processing a plurality of substrates unloaded from the cassette station, simultaneously in parallel;

in which the process station comprises:

a front-stage station block adjoined to the cassette station and having a plurality of first process units for processing a substrate;

a first main transfer arm mechanism arranged in the front-stage station block, for transferring a substrate to/from the sub-transfer arm mechanism and loading/unloading the substrate into/from the first process unit;

a rear-stage station block adjoined to the front-stage station block and having a plurality of second process units for processing a substrate; and a second main transfer arm mechanism arranged in the rear-stage station block for transferring a substrate to/from the first main transfer arm mechanism and loading/unloading the substrate into/from the second process unit;

a relative positional relationship between the first process units and the first main transfer arm mechanism is substantially the same as that of the second process units and the second main transfer arm mechanism; and the first main transfer arm mechanism also loads/unloads the substrate directly to at least one of second process units belonging to the rear-stage station block.

The first process unit comprises a plurality of first liquid units for applying a process liquid to the substrate, and a plurality of first thermal units for heating and cooling the substrate;

the second process unit comprises a plurality of second liquid units for applying a process liquid to the substrate, and a plurality of second thermal units for heating and cooling the substrate.

The first main transfer arm mechanism is surrounded by the first thermal units, part of the second thermal units, the first liquid units, and the second liquid units.

The first and second process units include a coating unit for coating at least one of a resist solution and an anti-reflection coating solution onto the substrate.

The apparatus according to the present invention further comprises a second sub-transfer arm mechanism for transferring the substrate to/from an exterior unit for exposing light to a resist coated on the substrate;

a final-stage main transfer arm mechanism for transferring the substrate to/from the second subtransfer arm mechanism; and a final-stage station block having a plurality of developing units and a plurality of third thermal units for loading/unloading the substrate by the final-stage main transfer arm mechanism.

The second main transfer arm mechanism loads/unloads the substrate to/from at least one of the developing units.

The second main transfer mechanism is surrounded by the second thermal units, the second coating units, part of the third thermal units, and part of the developing units.

The first and second station blocks have no partition therebetween and detachably connected to each other.

According to the present invention, there is provided an apparatus for processing a substrate, comprising:

a cassette station for loading/unloading a cassette storing a plurality of substrates;

a sub-transfer arm mechanism arranged in the cassette station for loading/unloading a substrate into/from the cassette;

a process station for processing a plurality of substrates unloaded from the cassette station, simultaneously in parallel;

in which the process station comprises a front-stage station block adjoined to the cassette station and having a plurality of first process units and a plurality of second process units for processing a substrate, a first main transfer arm mechanism provided in the front-stage station block, for transferring the substrate to/from the sub-transfer arm mechanism and loading/unloading the substrate into/from the first process unit, a second main transfer arm mechanism arranged in the front-stage station block, for transferring the substrate to/from the first main transfer arm mechanism and loading/unloading the substrate into/from the second process unit, a rear-stage station block adjoined to the front-stage station block and having a plurality of third process units for processing the substrate, and a third main transfer arm mechanism arranged in the rear-stage station block for transferring the substrate to/from the second main transfer arm mechanism and loading/unloading the substrate into/from the third process unit;

a relative positional relationship between the first process units and the first main transfer arm mechanism is substantially equal to a relative positional relationship between the second process units and the second man transport arm mechanism; and the first main transport arm mechanism loads the substrate directly into at least one of the second process units.

The first main transfer arm mechanism is surrounded by the first thermal units, part of the second thermal units, the first liquid units, and the second liquid units.

The first process unit includes a first coating unit for coating at least one of a resist solution and an anti-reflection coating solution onto the substrate.

The second process unit includes a second coating unit for coating at least one of a resist solution and an anti-reflection coating solution onto the substrate.

The third process unit includes a plurality of developing units for developing a resist coated on the substrate.

The second main transfer arm mechanism loads/unloads the substrate into/from at least one of the developing units.

The second main transfer arm mechanism is surrounded by the second thermal units, the second coating unit, part of the third thermal units, and part of the developing unit.

The rear-stage station block has a chemical filter for removing an alkaline component to supply clean air.

The apparatus according to the present invention further comprising a partition board provided between the front-stage station block and the rear-stage station block, the partition board having a loading/unloading port for passing the substrate held by the second main transfer arm mechanism.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Now, various preferable embodiments of the present invention will be explained with reference to the accompanying drawings.

Figure 1:
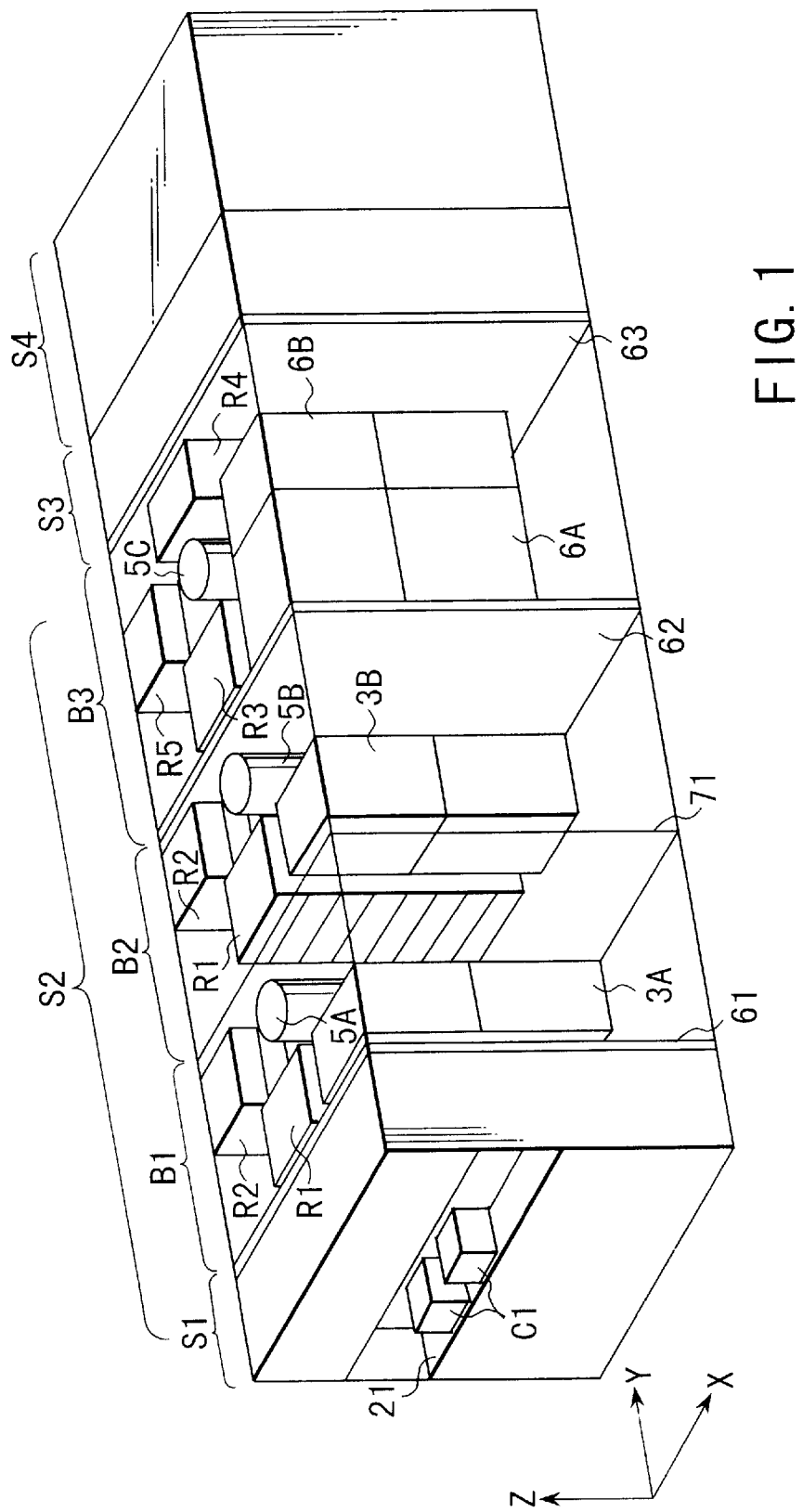
FIG. 1 is a schematic perspective view showing an entire structure of a substrate processing apparatus according to an embodiment of the present invention.
Figure 2:
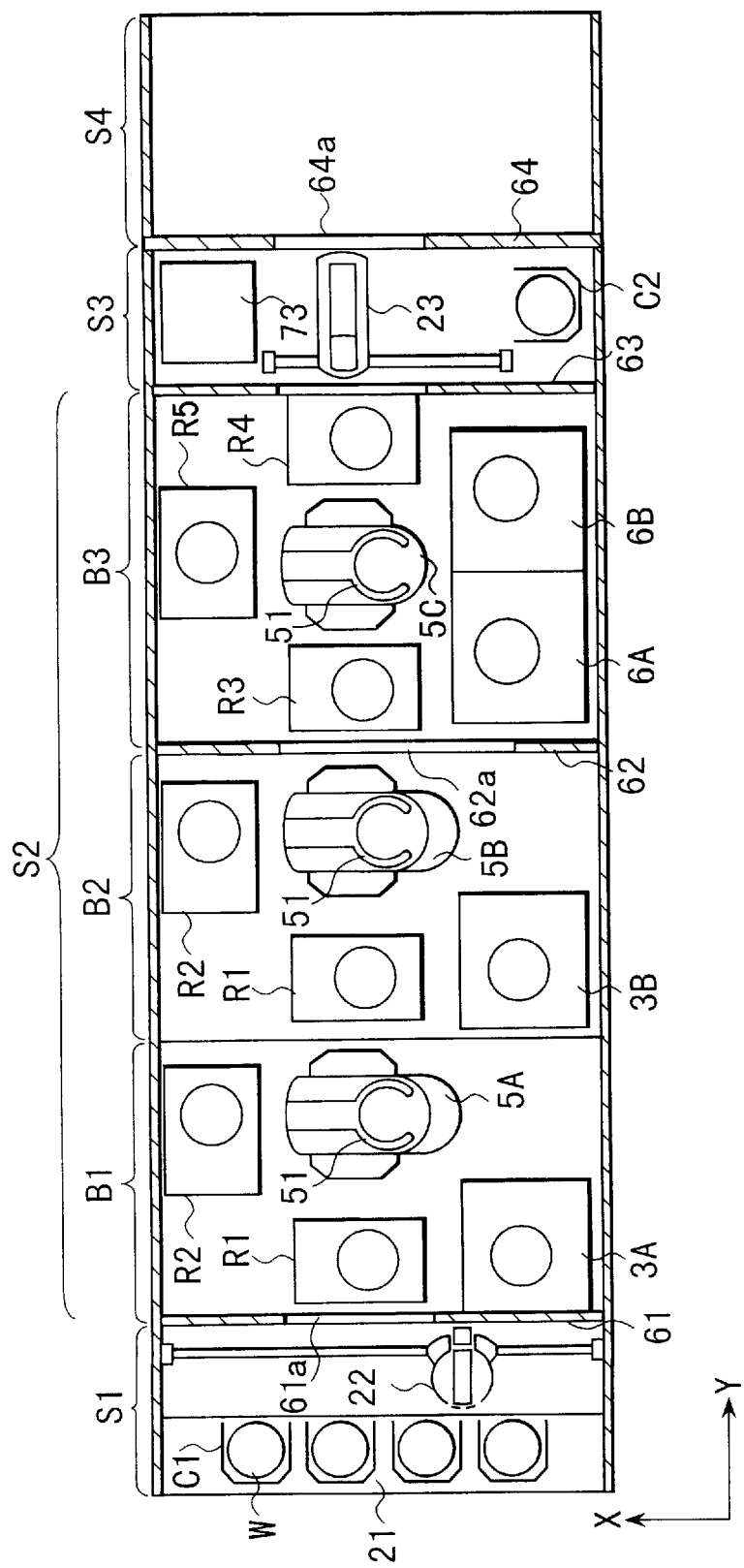
FIG. 2 is a schematic perspective plan view showing a substrate processing apparatus according to an embodiment of the present invention.

In FIGS. 1 and 2, a cassette station S1, a process station S2, an interface station S3, and a light exposure portion S4 are arranged in line along a Y axis in the order mentioned. Each of stations S1, S2, and S3 has an arm mechanism 22, 5 (A, B, C), and 23, respectively, for transporting a semiconductor wafer W.

The cassette station S1 has a cassette stage 21 and a first sub-transfer arm mechanism arm 22. Four cassettes C1 are mounted on the cassette stage 21. The first sub transfer arm mechanism arm 22 has a wafer holder 22a, a back-and-forth moving mechanism (not shown) for moving the wafer holder back and forth, an up-and-down moving mechanism (not shown) for moving the wafer holder in a z-axis direction, and a θ-rotation mechanism (not shown) for rotating the wafer holder around the z-axis. The arm 22 takes out a wafer W from the cassette C1 and loads it into a transfer unit (TRS) of the process station S2.

The process station S2 has three station blocks B1, B2 and B3. The first station block B1 is adjoined to the cassette station S1. The third station B3 is adjoined to the interface station S3. The second station block B2 is sandwiched between the first station block B1 and third station block B3.

Figure 3:
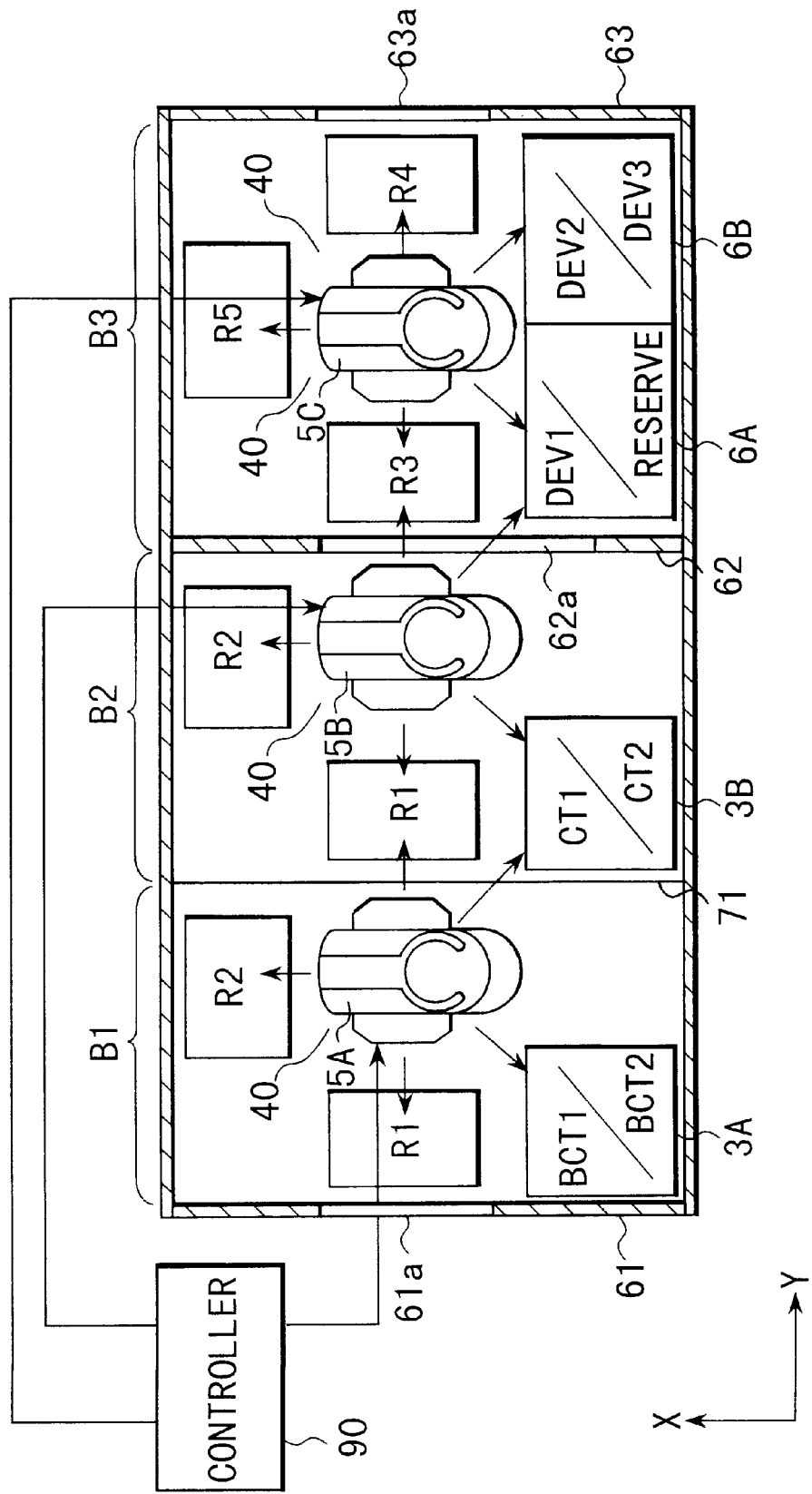
FIG. 3 is a perspective plan view showing a gist portion of a substrate processing apparatus according to an embodiment of the present invention.

Referring to FIGS. 2 and 3, an inner layout of the first and second station blocks B1 and B2 will be explained.

The first and second station blocks B1, B2 are substantially the same modules except coating sections 3A and 3B. More specifically, the first and second main transfer arm mechanisms 5A, 5B have the same structure in which the first and second thermal unit sections R1, R2 having the same structure are arranged in the completely same layout.

The first thermal unit section R1 is arranged in the station block B1 (B2) on the side close to the cassette station S1. The second thermal unit section R2 is arranged in the station block B1 (B2) on a rear side. The coating section 3A is arranged in the station block B1 (B2) on a front side.

The first and second station blocks B1, B2 are arranged side by side, the first transfer arm mechanism 5A keeps the same distance not only from each of the first thermal unit section R1 of the blocks B1 and B2 but also from each of the first and second coating sections 3A and 3B. More specifically, if the first and second station blocks B1 and B2 are connected, the first main transfer arm mechanism 5A are surrounded by the three thermal unit sections R1, R1 and R2 and two coating sections 3A, 3B. In other words, the first transfer arm mechanism 5A is located at a center of the layout consisting of three thermal unit sections R1, R1, R2 and two coating sections 3A, 3B.

The station block B3 arranged at a final stage differs in structure from the second station block B2. As shown in FIGS. 2 and 3, the layout of a left half of the third station block B3 is substantially the same as that of the second station block B2. Therefore, when the second station block B2 is arranged next to the third station block B3, the second main transfer arm mechanism 5B is located at an equal distance not only from each of three thermal unit sections R1, R1, R2 but also from each of the coating section 3B and a developing section 6A. In other words, the second main transfer arm mechanism 5B is located at a center of the layout consisting of three thermal unit sections R1, R1 R2, the coating section 3B, and the developing section 6A.

The station block B3 includes two developing sections 6A, 6B and three thermal unit sections R3, R4, R5, and the main transfer arm mechanism 5C. Although the detailed structures of the developing sections 6A and 6B are omitted from the figure, they have substantially the same structure as that of the coating section 3A or 3B shown in FIG. 4. The first developing section 6A has a developing unit (DEV1) only in an upper portion and its lower portion is vacant. The second developing section 6B has a second developing unit (DEV2) in an upper portion and a third developing unit (DEV3) in a lower portion.

The main transfer arm mechanism 5C is located in a center of the layout consisting of two developing sections 6A, 6B and three thermal unit sections R3, R4, R5. Two developing sections 6A, 6B are arranged at an equal distance from the main transfer arm mechanism 5C. Three thermal unit sections R3, R4, R5 are arranged at an equal distance from the main transfer arm mechanism 5C.

As shown in FIG. 3, there is no partition between the station blocks B1 and B2. The station blocks B1 and B2 are detachably connected by using a fasten bolt and a clamp arm (not shown). The station blocks B1 and B2 are connected at a connection portion 71 in the same plane without forming at least an inner discontinuous stepped portion. Furthermore, a sealing member (not shown) is inserted in the connection portion 71, so that airtightness within the process station S2 can be maintained to some extent.

A partition board 61 is provided between the first station block B1 and the cassette station S1. A loading port 61a is formed in the partition board 61. The wafer W is transferred between the cassette station S1 and the first station block B1 through the loading port 61a.

A partition board 62 is provided between the second station block B2 and the third station block B3. A loading port 62a is formed in the partition board 62. The wafer W is transferred between the second and third station blocks B2 and B3 through the loading port 62a.

A partition board 63 is provided between the third station block B3 and the interface station S3. A loading port 63a is formed in the partition board 63. The wafer W is transferred between the third station block B3 and the interface station S3 through the loading port 63a.

A partition board 64 is provided between the interface station S3 and the light exposure section S4. A loading port 64a is formed in the partition board 64. The wafer W is transferred between the interface station S3 and the light exposure section S4 through the loading port 64a.

An open/close shutter (not shown) is attached to each of the loading ports 61a, 62a, 63a, and 64a. The shutter is generally closed but opened when the wafer W passes through the loading ports 61a, 62a, 63a, and 64a. The loading ports 61a, 63a, 64a have substantially the same size. The loading port 62a is wider than the loading ports 61a, 63a, and 64a.

As shown in FIG. 3, the second main transfer arm mechanism 5B can transfer the wafer W directly from the second station block B2 to the developing section 6A of the third station block B3 through the wide loading section 62a. Furthermore, since there is no obstacle (partition) between the first and second station blocks B1, B2, the first main transfer arm mechanism 5A can transfer the wafer W directly to the second coating section 3B.

As mentioned above, the first main transfer arm mechanism 5A can transfer the wafer W to not only the coating section 3A of the first station block B1 but also the coating section 3B of the adjacent second station block B2. The second main transfer arm mechanism 5B transfers the wafer W to not only the coating section 3B of the second station block B2 but also the developing section 6A of the adjacent station block B3.

The interface station S3 has the second sub transfer arm mechanism 23 and a buffer cassette C2. The second sub transfer arm mechanism 23 is a transfer means for transferring the wafer W between the third station block B3 of the process station S2 and the light exposure section S4. A buffer cassette C2 is a temporary storing means for temporarily storing the wafer awaiting treatment.

Figure 4:
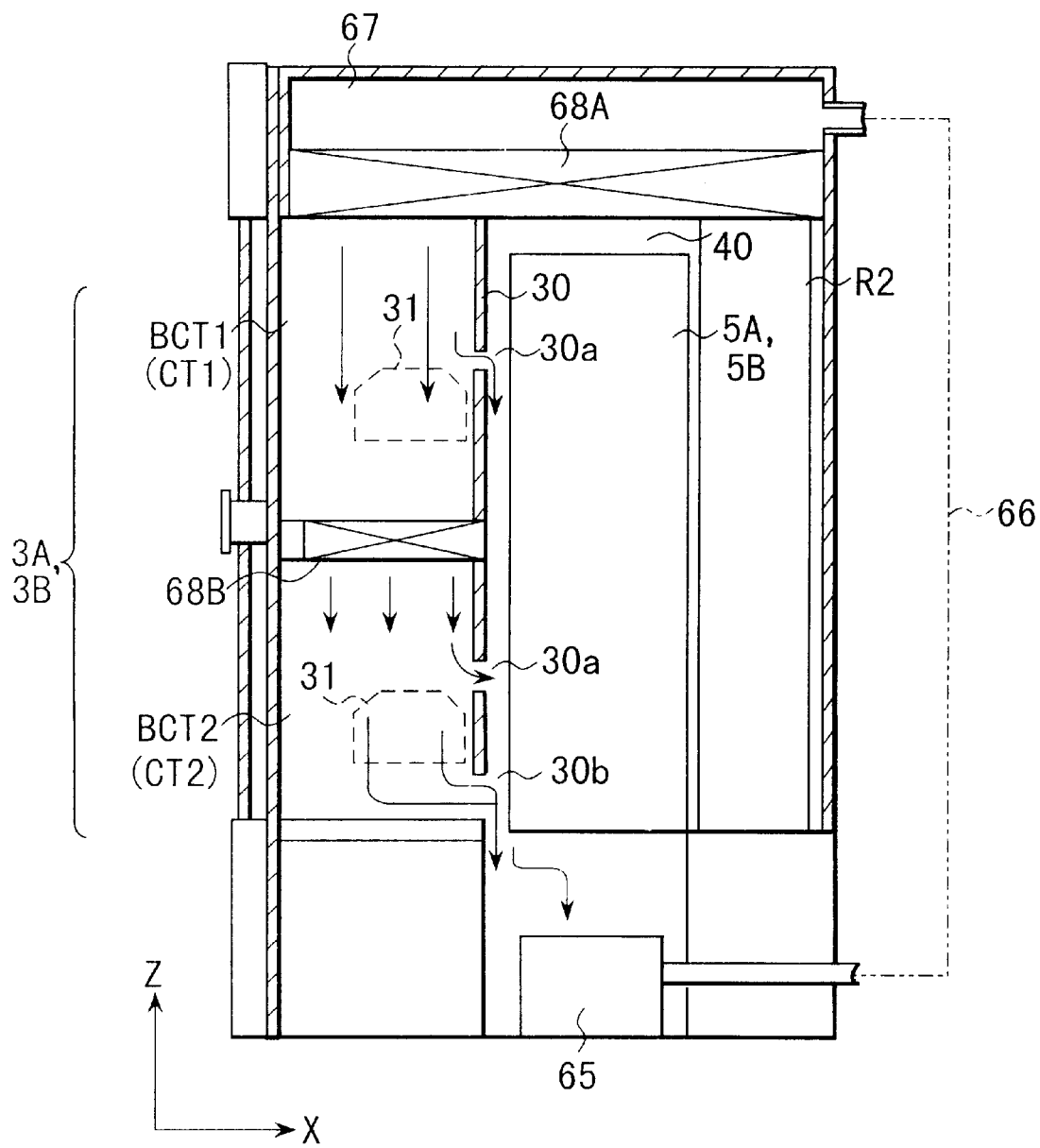
FIG. 4 is a perspective cross sectional view of a first station block as viewed from a side.
Figure 5:
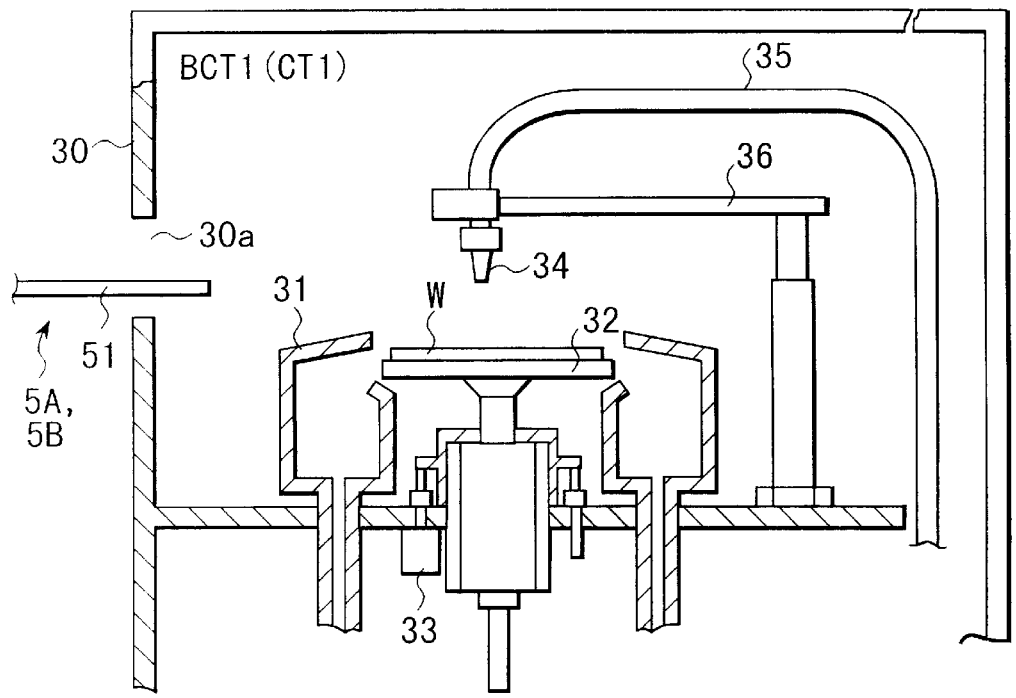
FIG. 5 is a perspective sectional view of a coating unit (BCT or CT) as viewed from a side.

Referring now to FIGS. 4 and 5, the coating section will be explained.

The first coating section 3A is provided in the first station block B1. The second coating section 3B is provided in the second station block B2. The first coating section 3A consists of coating units (BCT) vertically stacked. In each of the coating units (BCT), a bottom anti-reflection coating (BARC) film is coated on the wafer W. Furthermore, the second coating section 3B consists of the coating units (CT) vertically stacked. In each of the coating units (CT), a chemically amplified resist is coated on the wafer W.

Each of the coating units (BCT, CT) is surrounded by a case in its entirety. A fan filter unit 68A (FFU) is attached to the upper portion of the coating unit (BCT, CT) to form a descending flow of clean air flowing downward from the upper side. Another fan filter unit 68B is attached to the upper portion of the coating unit (BCT, CT) arranged in the lower portion to form a descending flow of clean air flowing downward from the upper side within the coating unit (BCT, CT). A loading port 30a is formed in a front surface board 30 of the coating unit (BCT, CT) to load/unload the wafer W in/from the coating unit (BCT, CT) through the loading port 30a. Note that the inner portion of the coating unit (BCT, CT) is communicated with a transfer space 40 through the coating port 30a and the lower opening 30b, so that the descending clean-air flow flows toward the transfer space 40 through the openings 30a, 30b.

A cup 31 is provided nearly at a center of the coating unit (BCT, CT). The cup 31 has an upper opening and a lower drain and is fixed at a bottom plate of a unit case. A spin chuck 32 is provided within the cup 31. The spin chuck 32 has a rotation driving mechanism (not shown), an up-and-down cylinder mechanism 33, and a vacuum adsorption mechanism (not shown). The spin chuck 32 is moved up and down by the up-and-down cylinder mechanism 33 from an operation position to a transfer portion located at the upper side within the cup 31. A holder 51 of the main transfer arm mechanism 5A (5B) is inserted into the transfer position to transfer the wafer W between the holder 51 and the spin chuck 32.

The nozzle 34 is movably supported by a supporting arm mechanism 36 in an upper portion of the coating unit (BCT, CT). The supporting arm mechanism 36 has a horizontal arm equipped with the nozzle 34 and a cylinder for moving the horizontal arm up and down, and a stepping motor for swinging the horizontal arm around a vertical axis. A BARC solution supply source (not shown) is connected (communicated) with the nozzle 34 of the coating unit (BCT) through a supply passage 35. Furthermore, a source of a chemically-amplified resist solution (not shown) is connected (communicated) with the nozzle 34 of the coating unit (CT) through the supply passage 35. Note that an air operation valve, a bellows pump, mass-flow controller, and etc. (not shown) are attached to the supply passage 35.

As shown in FIG. 4, the fan filter unit (FFU) 68A is attached onto the upper portion of the first station block B1. An exhaust unit 65 is fitted on the bottom of the block B1. The exhaust unit 65 is connected (communicated) with the upper space 67 through a circulation flow passage 66. An alkaline component removing unit (not shown) and a filter (not shown) are attached to the circulation flow passage 66 to remove alkaline components such as amine and ammonia, and particles. When vacuum evacuation is performed by the exhaust unit 65 while the clean air is supplied from FFU 68A, a descending clean air flow is formed within the station block B1.

The FFU 68B is also provided within the coating section 3A (3B). The FFU 68B is responsible for supplying clean air to a coating unit (BCT 2) in the lower portion. The clean air within the lower coating unit (BCT 2) flows into the transfer space 40 through the loading port 30a and the lower opening 30b, and merges with the clean air supplied from the FFU 68A.

Figure 6A:
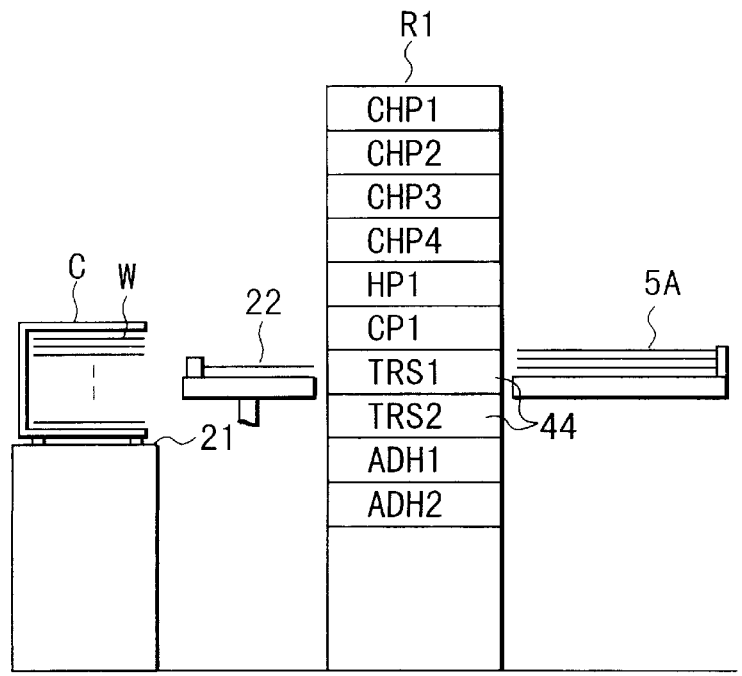
FIGS. 6A, 6B, 6C are schematic side views each showing stacked units for processing a substrate with heat and a main transportation arm mechanism.
Figure 6B:
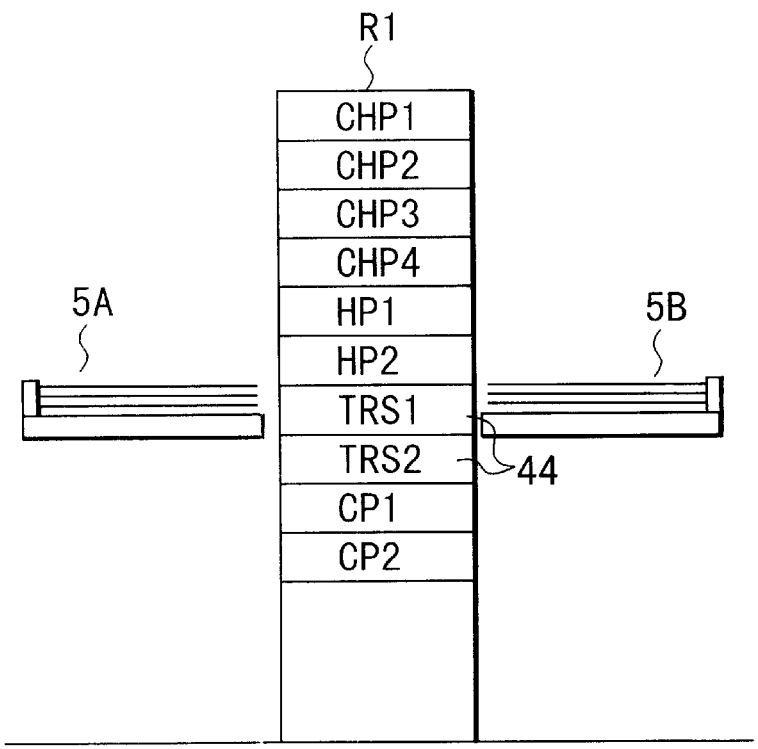
Figure 6C:
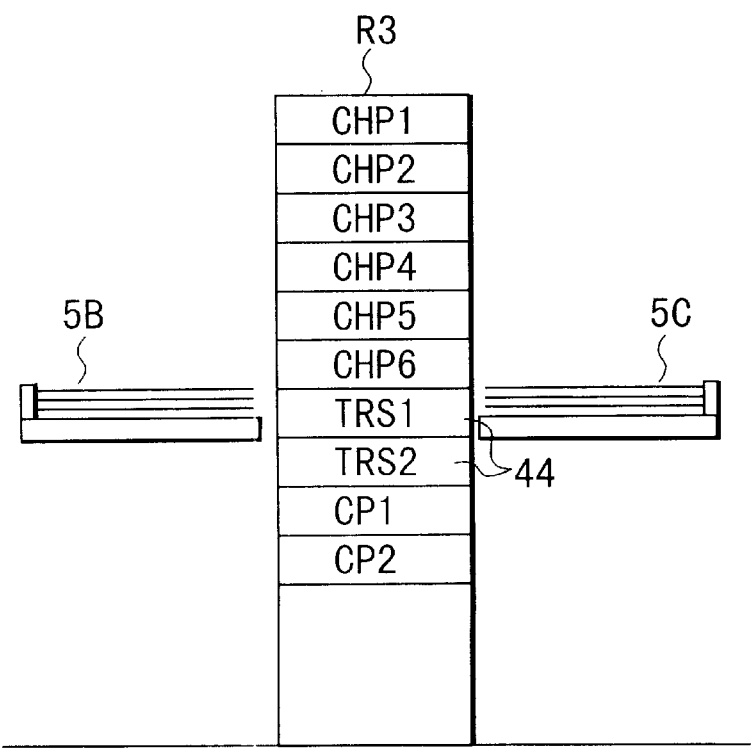

Referring now to FIGS. 6A, 6B, and 6C, the thermal unit section of each of the station blocks will be explained.

As shown in FIG. 6A, the thermal unit section R1 of the first station block B1 has four cooling/heating units (CHP1–4), a heating unit (HP1), a cooling unit (CP1), two transfer units 44 (TRS 1, 2), and two adhesion units (ADH 1, 2) stacked in the order mentioned from the above. The cooling/heating unit (CHP) has a heating plate, a cooling plate, and a transfer mechanism. The cooling plate is provided at an inlet side of the unit (CHP). The heating plate is provided at the back of the unit (CHP). The transfer mechanism is arranged between the heating plate and the cooling plate for transferring the wafer W from the heating plate to the cooling plate. The wafer W is first heated by the heating plate within the cooling/heating unit (CHP) and then transferred from the heating plate to the cooling plate, to thereby being cooled by the cooling plate.

As described, the number of the cooling/heating units (CHP), the heating unit (HP) and the cooling unit (CP) is larger than that of the coating units (CT/BCT).

Note that the second thermal unit section R2 is substantially the same as the first thermal unit section R1. Note that one of the transfer units 44 may be used as an alignment unit for aligning the wafer W.

As shown in FIG. 6B, in the thermal unit section R1 of the second station block B2, four cooling/heating units (CHP 1–4), two heating units (HP1, 2), two transfer units 44 (TRS1, 2), and two cooling units (CP1, 2) are stacked in the order mentioned from the above. Note that the second thermal unit section R2 is substantially the same as the first thermal unit section R1.

As shown in FIG. 6C, in the third unit section R3 of the third station block B3, six cooling/heating units (CHP 1–6), two transfer units 44 (TRS1, 2), two cooling units (CP1, 2) are stacked in the order mentioned from the above. Note that the fourth and fifth thermal unit sections R4, R5 are substantially the same as the third thermal unit section R3.

Figure 7:
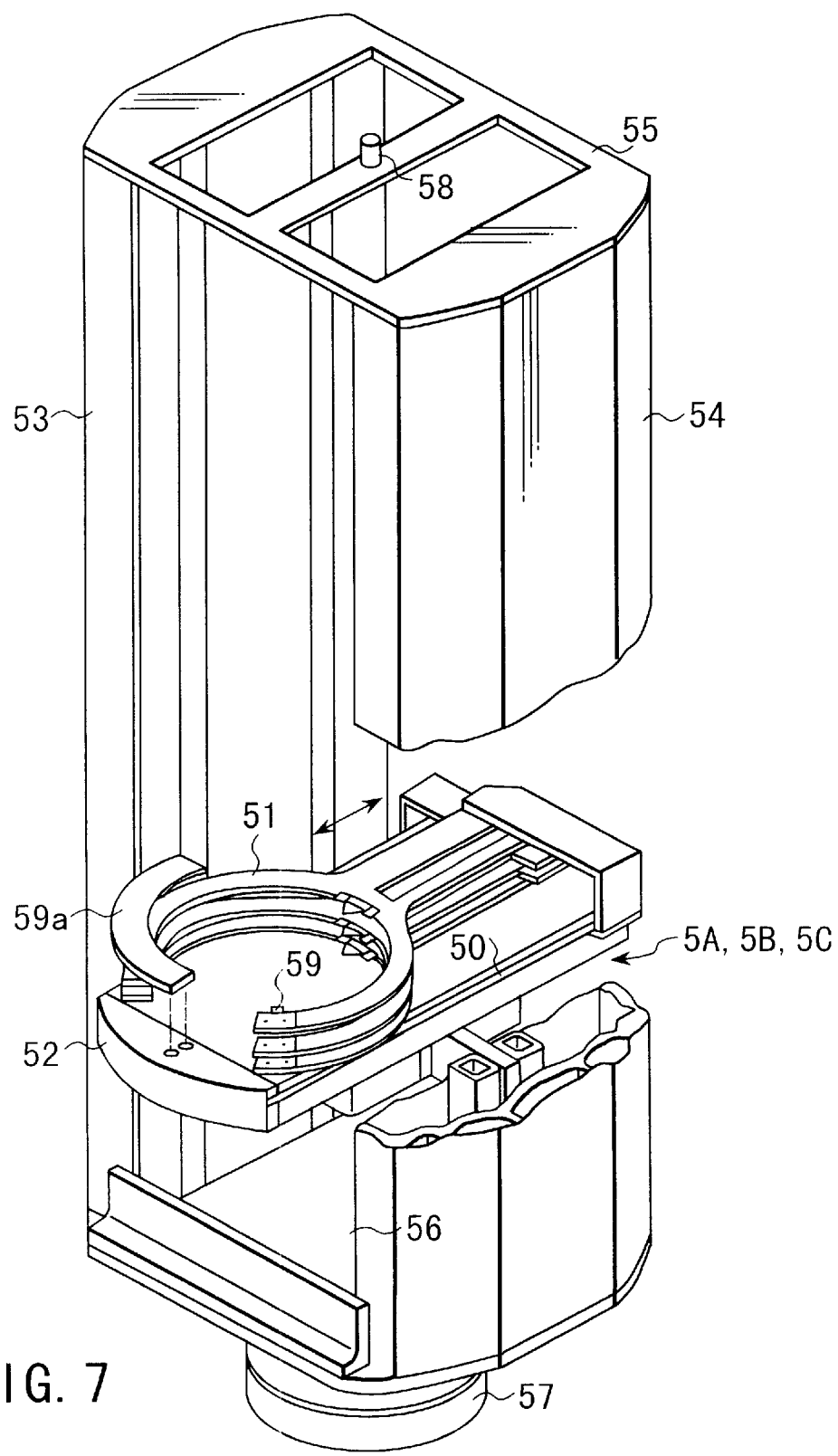
FIG. 7 is an oblique cutaway view of a part of the main transportation arm mechanism.

Next, referring to FIGS. 7, 3, and 4, the main transfer arm mechanism will be explained. Note that three main transfer arm mechanisms 5A, 5B, 5C are substantially the same. Therefore, the first transfer arm mechanism 5A will be explained on behalf of them.

The main transfer arm mechanism 5A has three arm holders 51 and a base table 52, a pair of linear guides 53, 54, connecting members 55, 56, a rotation drive section 57 and a rotation drive shaft 58. The three arm holders 51 are formed on the base table 52 and movably supported by a back-and-forth driving mechanism for independently moving each of the arm holders 51. Each of the arm holders 51 has three pieces of nail 59. Three pieces of nail 59 come into partial contact with the wafer W at a peripheral portion thereof, thereby supporting it. The proximal end portion of the arm holder 51 can be slidably moved along a guide groove 50 provided longitudinally along the base table 56.

The three arm holders 51 and the base table 52 are moved up and down by a z-axis driving mechanism (not shown) while guided through a pair of linear guides 53, 54. Upper ends of the pair of the linear guides are connected to each other with a connecting member 55. Lower ends of the pair of the linear guides 53, 54 are connected to each other with a connecting member 56. A longitudinal outer frame is formed of these members 53, 54, 55 and 56. A rotation driving section 57 is attached to the lower member 56 of the outer frame. On the other hand, a rotation shaft 58 is attached to the upper member 55 of the outer frame. Three arm holders 51 are rotated together with the outer frame around the Z-axis by the rotation driving section 57.

An optical sensor is attached to a sensor support member 59a fixed on the base table 52 for determining whether the wafer W is present or absent on the arm 51. A power supply circuit of each driving mechanism of the main transfer arm mechanisms 5A, 5B, 5C is connected to a controller 90. Operations of the mechanisms 5A, 5B, 5C are controlled by the controller 90.

Figure 8:
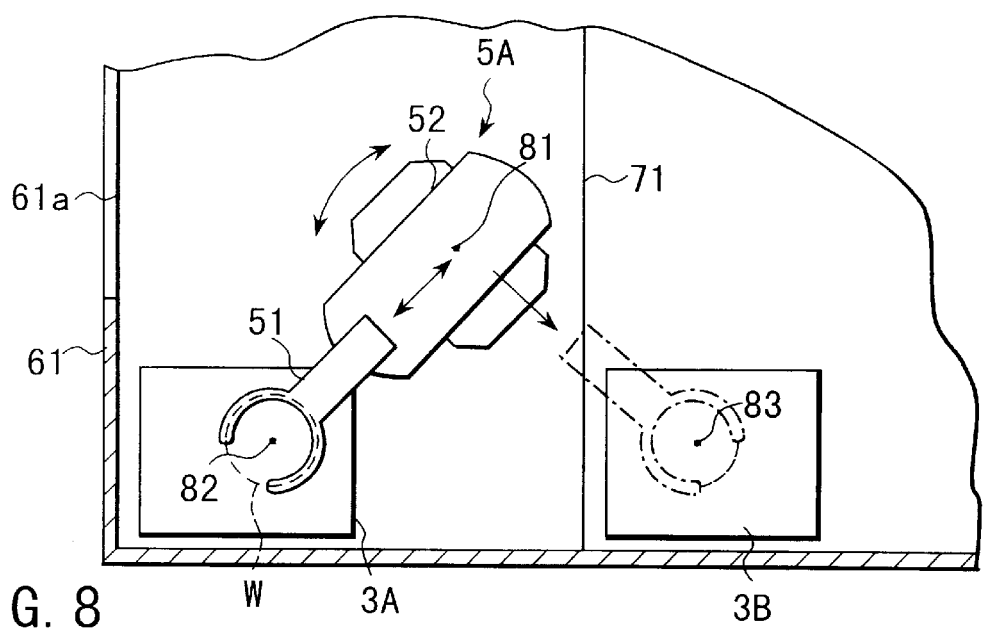
FIG. 8 is a schematic plan view showing how to transfer a wafer by the main arm mechanism directly from a coating unit (BCT) to another coating unit (CT)

As shown in FIG. 8, the distance between a rotation center 81 of the first main transfer arm mechanism 5A and a rotation center 82 of the spin chuck 32 of the first coating section 3A is equal to the distance between the rotation center 81 and a rotation center 83 of the spin chuck 32 of the second coating section 3B. The second main transfer arm mechanism 5B, the second coating section 3B and the first developing section 6A have the same positional relationship as described in the above, although the relationship is not shown in the figure. More specifically, the second main transfer arm mechanism 5B is equal in distance from each of a second coating section 3B and the first developing section 6A.

Figure 9:
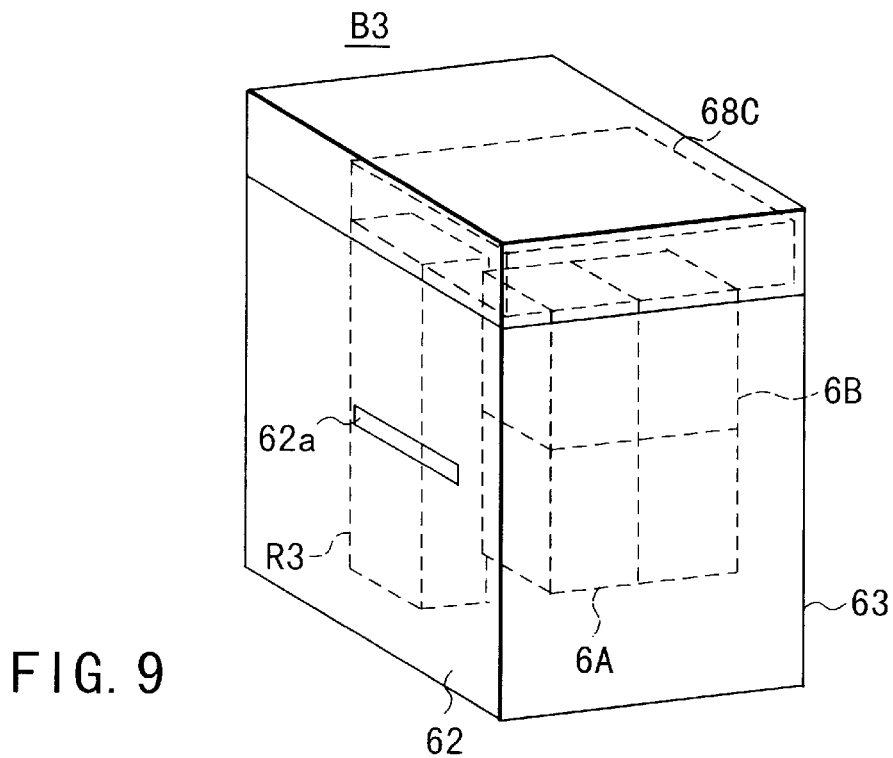
FIG. 9 is a schematic perspective view of a third station block.
Figure 10:
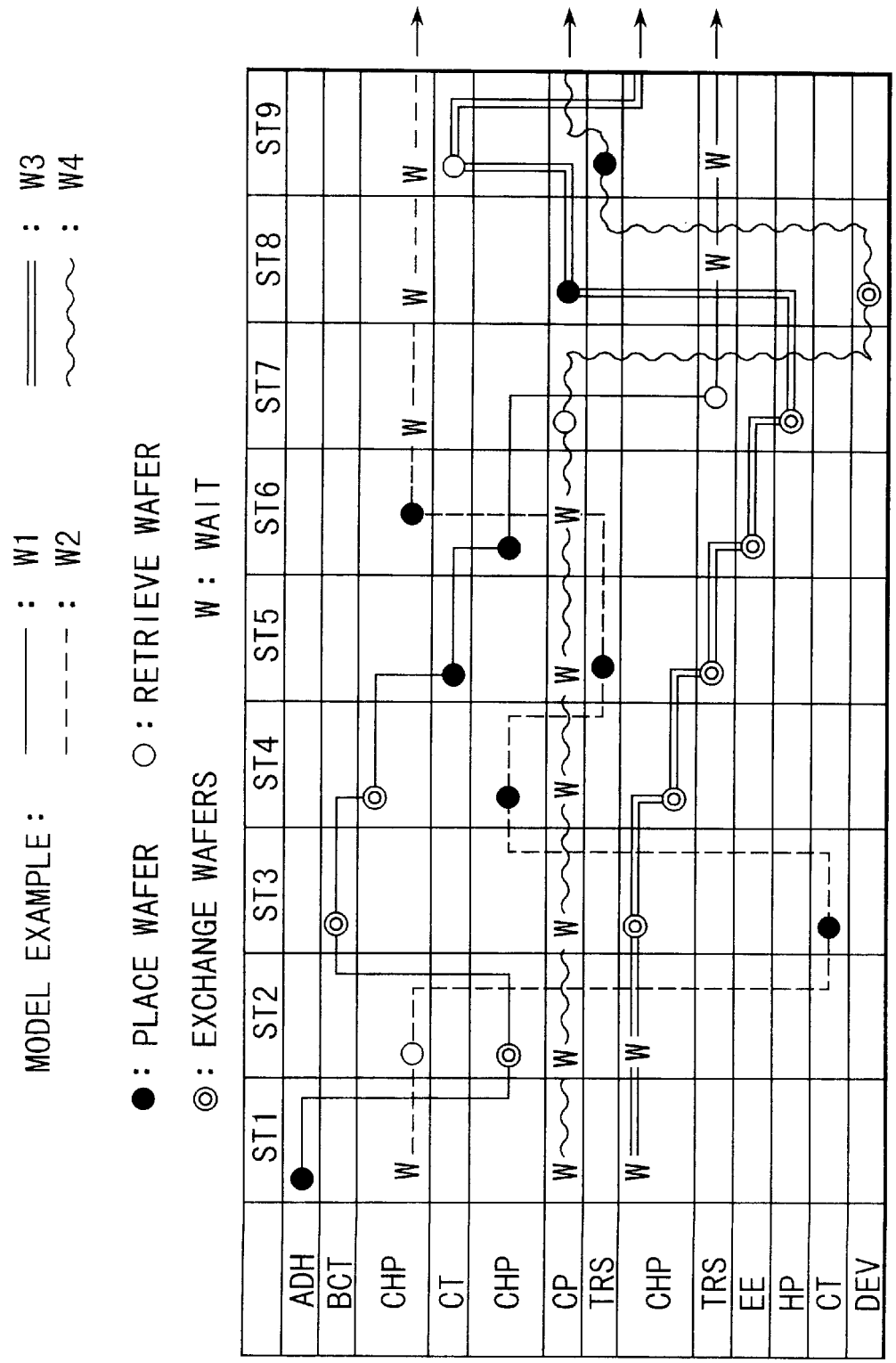
FIG. 10 is a flow chart showing the orders of processing a wafer.

As shown in FIG. 9, an FFU 68C is attached to a ceiling portion of the station block B3 of a final stage, for supplying clean air into the station block B3 through the FFU 68C. The FFU 68C has a filter for cleaning the air, that is, a chemical filter containing acid components for removing alkaline components such as ammonia and amines present in the air, and a vacuum fan. Since a chemically-amplified resist is used in this embodiment, it is necessary to prevent the alkaline component from entering into the atmosphere of a developing process, as much as possible. Therefore, the station block B3 in the final stage is covered with an exterior panel and a partition board 62, whereby the outer air is shut out from the inner atmosphere of the developing process of the block B3 to create a closed space. Furthermore, alkaline components are prevented from entering into the interior space of the block B3 by the FFU 68C having the chemical filter.

Referring now to FIGS. 10, 3–5, 6A–6C, we will explain a case where a plurality of wafers are processed simultaneously in parallel using the aforementioned apparatus.

First, an automatic transfer robot (not shown) or an operator mounts a cassette C1 on a stage 21. The cassette C1, for example, 25 sheets of silicon wafers W (8 inch in diameter) are stored in the cassette C1. Then, the wafer W is taken out from the cassette C1, transferred to the first station block B1 and loaded into the transfer unit 44 of the thermal unit section R1 by the sub arm mechanism 22.

Then, the first main transfer arm mechanism 5A transfers the wafer W1 to the transfer unit 44 to an adhesion unit (ADH). In the adhesion unit (ADH), HMDS vapor is applied to a wafer W1 while heating it. As a result, the surface of the wafer W1 is rendered hydrophobic to improve resist adhesiveness (Step ST1).

Subsequently, the first main transfer arm mechanism 5A transfers the wafer W1 from the adhesion unit (ADH) to the cooling/heating unit (CHP). Since the cooling/heating unit (CHP) already stores another wafer W2 in advance, the main transfer arm mechanism 5A unloads the wafer W2 and simultaneously loads the wafer W1 into the unit (CHP). Thereafter, the wafer W1 is cooled (Step ST2). During the cooling of the wafer, the main transfer arm mechanism 5A transfers the wafer W2 directly to a second coating section 3B. The wafer W2 is coated with a resist solution (Step ST3).

The main transfer arm mechanism 5A transfers the wafer W1 from the cooling/heating unit (CHP) to the first coating section 3A. Then, the wafer W1 is loaded into the coating unit (BCT) to coat the BARC solution onto the wafer W1 (Step ST3).

Subsequently, the main transfer arm mechanism 5A transfers the wafer W1 from the coating unit (BCT) to a cooling/heating unit (CHP). Since the cooling/heating unit (CHP) already stores another wafer W3 in advance, the main transfer arm mechanism 5A unloads the wafer W3 and simultaneously loads the wafer W1 into the unit (CHP). The wafer W1 is heated in the unit (CHP) to a predetermined temperature to bake the BARC film and immediately cooled to a predetermined temperature (Step ST4). Note that another wafer W3 is transferred to a peripheral light exposure unit 73 through the transfer unit 44. In the peripheral light exposure unit 73, a peripheral region of the wafer W3 is exposed to light (Step ST6).

The main transfer arm mechanism 5A directly transfers the wafer W1 from the cooling/heating unit (CHP) to a second coating section 3B. Then, the wafer W1 is loaded into the coating unit (CT) to coat a chemically amplified resist solution onto the wafer W1 (Step ST5).

Subsequently, the main transfer arm mechanism 5A transfers the wafer W1 from the coating unit (CT) to the cooling/heating unit (CHP). In the cooling/heating unit (CHP), the wafer W1 is first heated by a heating plate (not shown) and then transferred from the heating plate to a cooling plate, by which the wafer W1 is immediately cooled (Step ST6).

Then, the second main transfer arm mechanism 5B transfers the wafer W1 from the cooling/heating unit (CHP) to the transfer unit 44 of the unit section R3. Furthermore, the third main transfer arm mechanism 5C transfers the wafer W1 from the transfer unit 44 of the unit section R3 to the transfer unit 44 of the unit section R4 (Step ST 7).

Furthermore, the second sub transfer arm mechanism 23 transfers the wafer W1 from the transfer unit 44 to the buffer cassette C2. Then, the wafer W1 is allowed to stand within the buffer cassette C2 until the light exposure section S4 is ready to receive the wafer W1 (Steps ST8, 9).

During the stand-by time, the third main transfer arm mechanism 5C transfers another wafer W4 from the cooling unit (CP) to a developing unit (DEV) to develop the wafer W4 (Step ST8). Then, the third main transfer arm mechanism 5C transfers the wafer W4 from a developing unit (DEV) to the transfer unit 44 (Step ST9).

Note that the controller 90 selects the most suitable transfer route of a plurality of transfer routes and sends an instruction signal to each of the first, second, and third main transfer arm mechanisms 5A, 5B, and 5C. For example, if the coating section 3A cannot be used, the main transfer arm mechanism 5A transfers the wafer W directly to the coating section 3B of the next second station block B2. Finally the wafer W is transferred to the first station block B1 and returned to the cassette C1, from which the wafer W is originally taken out, through the transfer portion 44.

According to the aforementioned embodiment, the first main transfer arm mechanism 5A directly transfers the wafer W not only to the coating section 3A of the block B1 to which the mechanism 5A belongs, but also to the coating section 3B of the adjacent block B2. Furthermore, the second main transfer arm mechanism 5B directly transfers the wafer W not only to the coating section 3B of the block B2 to which the mechanism 5B itself belongs, but also to the developing section 6A of the adjacent block B3. With this mechanism, the throughput of this process can be drastically improved.

According to the aforementioned embodiment, it is possible for the first and second main transfer arm mechanisms 5A, 5B to gain access to the coating section 3B of the second block B2. Therefore, when the coating section 3A of the first block B1 cannot be used, the wafer W can be directly transferred from the first main transfer arm mechanism 5A to the coating section 3B of the second block B2 without passing through the transfer section 44 and the second main transfer arm mechanism 5B. As described, there are many possible transfer routes for the wafer W, so that the controller 90 has a higher degree of flexibility in selecting a transfer route.

Furthermore, the number of the main transfer arm mechanisms accessible to a process unit increases, load of each of the main transfer arm mechanisms can be reduced.

Furthermore, according to the aforementioned embodiment, the process station S2 can be easily expanded by further adding the third or fourth station blocks, which is completely identical to the first and second station blocks B1, B2.

Furthermore, the first and second station blocks B1, B2 are designed in modules. It is therefore easy to manufacture and assemble the structural members, with the result that a manufacturing cost is reduced.

Figure 11:
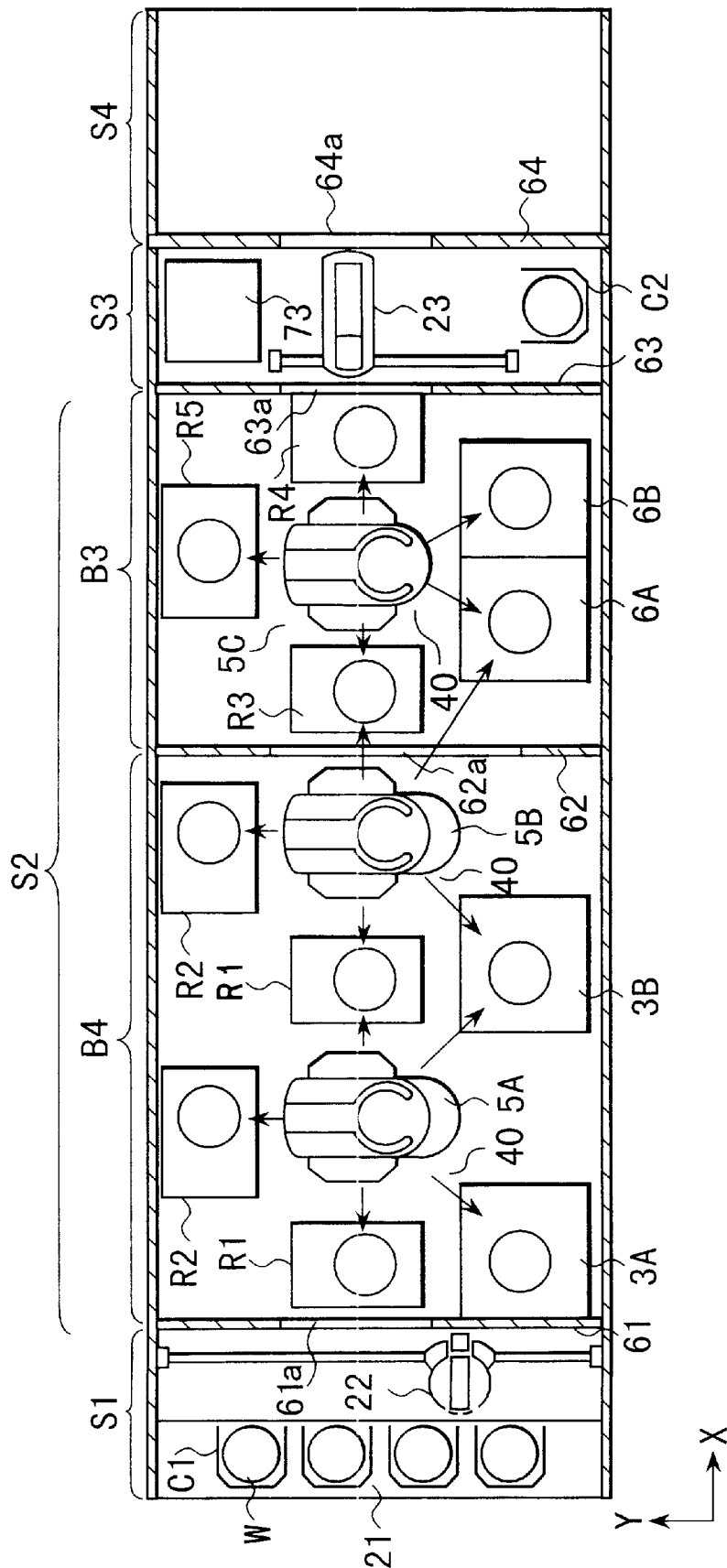
FIG. 11 is a perspective plan view of a substrate processing apparatus according to another embodiment of the present invention.

Subsequently, referring to FIG. 11, another embodiment of the present invention will be explained. Note that explanations for the parts of this embodiment in common with those of the aforementioned embodiment will be omitted.

The process station S2 of this embodiment has a station block B4 in the front stage (front-stage station block B4) and a station block B3 in the final stage. The station block in the final stage is the same as in the aforementioned embodiment. The front-stage station block B4 has two main transfer arm mechanisms 5A, 5B, two coating sections 3A, 3B, and four thermal unit sections R1, R1, R2, R2. The constitutional elements 5A, 5B, 3A, 3B, R1, R2 belonging to the front-stage station block B4 are the same as those obtained by combining the first and second station blocks B1, B2 of the aforementioned embodiment. The layout (mutual positional relationship) of these constitutional elements 5A, 5B, 3A, 3B, R1, R2 in the block B4 is substantially the same as that obtained by combining the first and second station blocks B1 and B2.

In the station block B4 thus arranged, it is possible for the first main transfer arm mechanism 5A to transfer the wafer W directly to not only the first coating section 3A but also the second coating section 3B. Furthermore, it is possible for the second main transfer arm mechanism 5B to transfer the wafer W directly to not only the second coating section 3B but also the developing section 6A. Thus, it is possible to increase flexibility in processing and thereby to increase the throughput.

According to the apparatus of this embodiment, the front-stage station block B4 is formed in an integrated form. As a result, there is no seam (no connecting portion 71) between the first main transfer arm mechanism 5A and the second main transfer arm mechanism 5B. It is therefore possible to improve airtightness of the process station S2.

According to the apparatus of this embodiment, it is easy to install the apparatus in a clean room, compared to the apparatus of the previous embodiment.

In the present invention, the coating section and the developing section may be present together in the front-stage station block. The coating section and the developing section may be present together in the final-stage station block.

Furthermore, the partition board between the front-stage station block and the final-stage station block is not always required.

The substrate to be used in the present invention is not limited to a semiconductor wafer alone. Another type of substrate such as a glass substrate for a liquid crystal display may be used.

The processing solution to be used in the present invention is not limited to the BARC solution, a resist solution, and a developing solution. A solution containing a precursor of silicon oxide $SiO_2$ for use in forming an interlayer insulating film, may be included.

The coating unit for applying a coating agent on the wafer by spin-coating may be formed on a process station and used as the coating apparatus for forming a silicon oxide film $SiO_2$ film (after the formation of the $SiO_2$ film, a heating process is required).

From the foregoing, it is clear that the present invention is effective in obtaining a high throughput even if the substrate processing device has a plurality of process units. Furthermore, since a plurality of the station blocks designed in module are connected to each other, it is easy to manufacture and assemble them and thus effective in cost performance.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An apparatus for processing a substrate, comprising
   a cassette station for loading and unloading a cassette storing a plurality of substrates;
   a sub-transfer arm mechanism arranged in the cassette station, for loading/unloading a substrate into/from the cassette; and
   a process station for processing a plurality of substrates unloaded from the cassette station, simultaneously in parallel;
   wherein
   the process station comprises:
      a front-stage station block adjoined to the cassette station and having a plurality of first process units for processing a substrate;
      a first main transfer arm mechanism arranged in the front-stage station block, for transferring a substrate to/from the sub-transfer arm mechanism and loading/unloading the substrate into/from the first process unit;
      a rear-stage station block adjoined to the front-stage station block and having a plurality of second process units for processing a substrate; and a second main transfer arm mechanism arranged in the rear-stage station block for transferring a substrate to/from the first main transfer arm mechanism and loading/unloading the substrate into/from the second process unit;

a relative positional relationship between the first process units and the first main transfer arm mechanism is substantially the same as that of the second process units and the second main transfer arm mechanism; and the first main transfer arm mechanism also loads/unloads the substrate directly to at least one of second process units belonging to the rear-stage station block.

2. The apparatus according to claim 1, wherein the process station comprises a station block adjoined to the rear-stage station block or a k-th station block (k is an integer of 3 or more) from the cassette station, the k-th station block having a process unit and a k-th main transfer arm mechanism;

a (k+1)-th station block (k is an integer of 3 or more) adjoined to the k-th station block, the (k+1)-th station block having a process unit and a (k+1)-th main transfer arm mechanism, the k-th main transfer arm mechanism transferring the substrate to/from both the process unit belonging to the k-th station block and the process unit belonging to the (k+1) station block, and a relative positional relationship between the process unit belonging to the k-th station block and the k-th main transfer arm mechanism being the same as a relative relationship between the process unit belonging to the (k+1)-th station block and the (k+1)th main transfer arm mechanism.

3. The apparatus according to claim 1, wherein the first process unit comprises a plurality of first liquid units for applying a process liquid to the substrate, and a plurality of first thermal units for heating and cooling the substrate;

the second process unit comprises a plurality of second liquid units for applying a process liquid to the substrate, and a plurality of second thermal units for heating and cooling the substrate.

4. The apparatus according to claim 3, wherein the first main transfer arm mechanism is surrounded by the first thermal units, part of the second thermal units, the first liquid units, and the second liquid units.

5. The apparatus according to claim 1, wherein the first and second process units include a coating unit for coating at least one of a resist solution and a anti-reflection coating solution onto the substrate.

6. The apparatus according to claim 5, further comprising a second sub-transfer arm mechanism for transferring the substrate to/from an exterior unit for exposing light to a resist coated on the substrate;

a final-stage main transfer arm mechanism for transferring the substrate to/from the second subtransfer arm mechanism; and a final-stage station block having a plurality of developing units and a plurality of third thermal units for loading/unloading the substrate by the final-stage main transfer arm mechanism.

7. The apparatus according to claim 6, wherein the second main transfer arm mechanism loads/unloads the substrate to/from at least one of the developing units.

8. The apparatus according to claim 6, wherein the second main transfer mechanism is surrounded by the second thermal units, the second coating units, part of the third thermal units, and part of the developing units.

9. The apparatus according to claim 6, wherein the final stage-station block has a chemical filter for removing an alkaline component to supply clean air.

10. The apparatus according to claim 1, wherein the first and second station blocks have no partition therebetween and detachably connected.

11. An apparatus for processing a substrate, comprising:

a cassette station for loading/unloading a cassette storing a plurality of substrates;

a sub-transfer arm mechanism arranged in the cassette station for loading/unloading a substrate into/from the cassette;

a process station for processing a plurality of substrates unloaded from the cassette station, simultaneously in parallel;

wherein the process station comprises a front-stage station block adjoined to the cassette station and having a plurality of first process units and a plurality of second process units for processing a substrate, a first main transfer arm mechanism provided in the front-stage station block, for transferring the substrate to/from the sub-transfer arm mechanism and loading/unloading the substrate into/from the first process units, a second main transfer arm mechanism arranged in the front-stage station block, for transferring the substrate to/from the first main transfer arm mechanism and loading/unloading the substrate into/from the second process units, a rear-stage station block adjoined to the front-stage station block and having a plurality of third process units for processing the substrate, and a third main transfer arm mechanism arranged in the rear-stage station block for transferring the substrate to/from the second main transfer arm mechanism and loading/unloading the substrate into/from the third process unit;

a relative positional relationship between the first process units and the first main transfer arm mechanism is substantially equal to a relative positional relationship between the second process units and the second man transport arm mechanism; and the first main transport arm mechanism loads the substrate directly into at least one of the second process units.

12. The apparatus according to claim 11, wherein the second main transport arm mechanism loads the substrate into the part of the third process unit.

13. The apparatus according to claim 11, wherein the first process unit includes a plurality of first liquid units for applying a processing liquid to the substrate and a plurality of first thermal units for heating and cooling the substrate;

the second process unit includes a plurality of second liquid units for applying a process liquid to the substrate and a plurality of second thermal units of heating and cooling the substrate.

14. The apparatus according to claim 13, wherein the first main transfer arm mechanism is surrounded by the first thermal units, part of the second thermal units, the first liquid units, and the second liquid units.

15. The apparatus according to claim 11, wherein the first process unit includes a first coating unit for coating at least one of a resist solution and an anti-reflection coating solution onto the substrate, and the second process unit includes a second coating unit for coating at least one of a resist solution and an anti-reflection coating solution onto the substrate.

16. The apparatus according to claim 15, wherein the third process unit includes a plurality of developing units for developing a resist coated on the substrate.

17. The apparatus according to claim 16, wherein the second main transfer arm mechanism loads/unloads the substrate into/from at least one of the developing units.

18. The apparatus according to claim 16, wherein the second main transfer arm mechanism is surrounded by the second thermal units, the second coating unit, part of the third thermal units, and part of the developing units.

19. The apparatus according to claim 16, wherein the rear-stage station block has a chemical filter for removing an alkaline component to supply clean air.

20. The apparatus according to claim 11, further comprising a partition board provided between the front-stage station block and the rear-stage station block, the partition board having a loading/unloading port for passing the substrate held by the second main transfer arm mechanism.

* * * * *